United States Patent
Kojovic (10) Patent No.: US 6,680,608 B2
(45) Date of Patent: Jan. 20, 2004

(54) MEASURING CURRENT THROUGH AN ELECTRICAL CONDUCTOR

(75) Inventor: Ljubomir A. Kojovic, Racine, WI (US)

(73) Assignee: McGraw-Edison Company, Houston, TX (US)

(*) Notice: Subject to any disclaimer, the term of this patent is extended or adjusted under 35 U.S.C. 154(b) by 0 days.

(21) Appl. No.: 10/083,646

(22) Filed: Feb. 27, 2002

(65) Prior Publication Data

US 2003/0160603 A1 Aug. 28, 2003

(51) Int. Cl.$^7$ .............................................. G01R 19/00
(52) U.S. Cl. ................................... 324/127; 324/117 R
(58) Field of Search ........................... 324/127, 117 R, 324/144, 145, 117 H, 110

(56) References Cited

U.S. PATENT DOCUMENTS

| | | | |
|---|---|---|---|
| 4,709,205 A | 11/1987 | Baurand et al. | 324/127 |
| 4,749,940 A | * 6/1988 | Bullock | 324/127 |
| 4,933,630 A | 6/1990 | Dupraz | 1/407 |
| 4,939,449 A | 7/1990 | Cattaneo et al. | 324/117 R |
| 5,414,400 A | 5/1995 | Gris et al. | 336/174 |
| 5,442,280 A | 8/1995 | Baudart | 324/127 |
| 5,461,309 A | 10/1995 | Baudart | 324/127 |
| 5,852,395 A | 12/1998 | Bosco et al. | 336/174 |
| 6,313,623 B1 | 11/2001 | Kojovic et al. | 324/127 |

OTHER PUBLICATIONS

T & M Research Products Inc., "Current Viewing Probe"; pp. 35 and 36, published prior to Feb. 27, 2001.

G. Schett et al., "Intelligent GIS–A Fundamental Change in the Combination of Primary and Secondary Equipment", CIGRE, 1996, Switzerland, pp. 1–10 No month available.

V. Heumann, "Magnetischer Spannungsmesser Hoher Praazision," Elektrotechnische Zeitschrift Ausgabe A, May 21, 1962, Germany, pp. 349–356.

Ljubomir Kojovic, "Rogowski Coils Suit Relay Protection and Measurement"; Jul. 1997, pp. 47–52.

E. Thuries, et al.; "Contribution of Digital Signal Processing in the Field of Current Transformers"; 1996, pp. 1–11. No month available.

P. Mahonen et al., "The Rogowski Coil and the Voltage Divider in Power System Protection and Monitoring"; 1996, pp. 1–7. No month available.

* cited by examiner

Primary Examiner—N. Le
Assistant Examiner—Vinvent Q. Nguyen
(74) Attorney, Agent, or Firm—Fish & Richardson, P.C.

(57) ABSTRACT

A coil includes a first portion, a second portion, a third portion, and a fourth portion. The first portion is wound in a first direction around a first core and the second portion is wound in the first direction around a second core. The third portion is wound in a second direction that is different from the first direction around a third core such that the third portion is decoupled from the first and second portions. Additionally, the fourth portion is wound in the second direction around a fourth core and decoupled from the first and second portions. An inner area is formed by arranging the portions and a voltage is induced in the coil if an electrical conductor is placed in the inner area.

25 Claims, 11 Drawing Sheets

MEASURING CURRENT THROUGH AN ELECTRICAL CONDUCTOR

TECHNICAL FIELD

This application relates to measuring current through an electrical conductor.

BACKGROUND

Coils such as Rogowski coils are used to measure current through an electrical conductor.

SUMMARY

In one general aspect, a coil includes a first portion, a second portion, a third portion, and a fourth portion. The first portion is wound in a first direction around a first core and the second portion is wound in the first direction around a second core. The third portion is wound in a second direction that is different from the first direction around a third core such that the third portion is decoupled from the first and second portions. Additionally, the fourth portion is wound in the second direction around a fourth core and decoupled from the first and second portions. A inner area is formed by arranging the portions such that the first portion mates with the second portion and the third portion mates with the fourth portion. A voltage is induced in the coil if an electrical conductor is placed in the inner area.

Implementations may include one or more of the following features. For example the first and third portions may be connected at a first connection point, the third and fourth portions may be connected at a second connection point, and the fourth and second portions may be connected at a third connection point. In this case, the voltage induced in the coil may be measured across the first and second portions of the coil. Alternatively, the first and second portions may be connected at a fourth connection point and the voltage induced in the coil may be measured across the second connection point and the fourth connection point.

The first portion may be traced on a first printed circuit board that forms the first core and the second portion may be traced on a second printed circuit board that forms the second core. Likewise, the third portion may be traced on a third printed circuit board that forms the third core and the fourth portion may be traced on a fourth printed circuit board that forms the fourth core. The first and second printed circuit boards may be laminated with the third and fourth printed circuit boards.

The first and second portions may mate to form a first loop and the third and fourth portions mate to form a second loop. Thus, the first and second loops may define the inner area. The first and second loops may be rectangular, circular, or elliptical.

The first direction may be clockwise and the second direction may be counterclockwise. The first, second, third, and fourth cores may be non-magnetic.

The coil may include a fifth portion wound in the first direction around a fifth core and a sixth portion wound in the second direction around a sixth core. In this case, the inner area is formed by arranging the portions such that the first, second, and fifth portions mate with each other and the third, fourth, and sixth portions mate with each other. The first, second, and fifth portions may mate to form a first loop and the third, fourth, and sixth portions mate to form a second loop.

The coil may be implemented in a system that includes a voltage measuring device that measures a voltage induced in the coil when an electrical conductor is placed in the inner area. The system may also include a current calculating device connected to the voltage measuring device and configured to calculate the current through the electrical conductor based on the measured voltage.

Aspects of the techniques and systems can include one or more of the following advantages. The coil exhibits improved current measurement accuracy because each of the portions are identically and separately wound and then located near each other. Thus, the coil can better account for effects of fields not produced by the electrical conductor. Additionally, the improved current measurement accuracy results from the reduction of unwanted influence due to external electromagnetic fields and due to internal electromagnetic fields. In particular, influence due to external fields was measured in tests to be less than or equal to 0.2% and influence due to internal fields was measured in tests to be less than or equal to 0.6%. Moreover, the accuracy of the coil matches or exceeds the accuracy of a high-precision laboratory current transformer, which is used for measuring current through an electrical conductor.

The coil may be made of any shape and size because it is made of portions that may be joined together to accommodate any size electrical conductor. Each of the first and second loops of the coil may be made of any suitable number of portions, such as, for example, three or four portions. Additionally, the shape of the coil may be adjusted by adjusting the shape of each of the portions that make up the first and second loops. One of the portions that forms a loop may have a shape that is different from the shape of the other portion that forms that loop. In this way, an asymmetrical coil may be formed.

Other features and advantages will be apparent from the description, the drawings, and the claims.

DESCRIPTION OF DRAWINGS

Like reference symbols in the various drawings indicate like elements.

DETAILED DESCRIPTION

Figure 1:
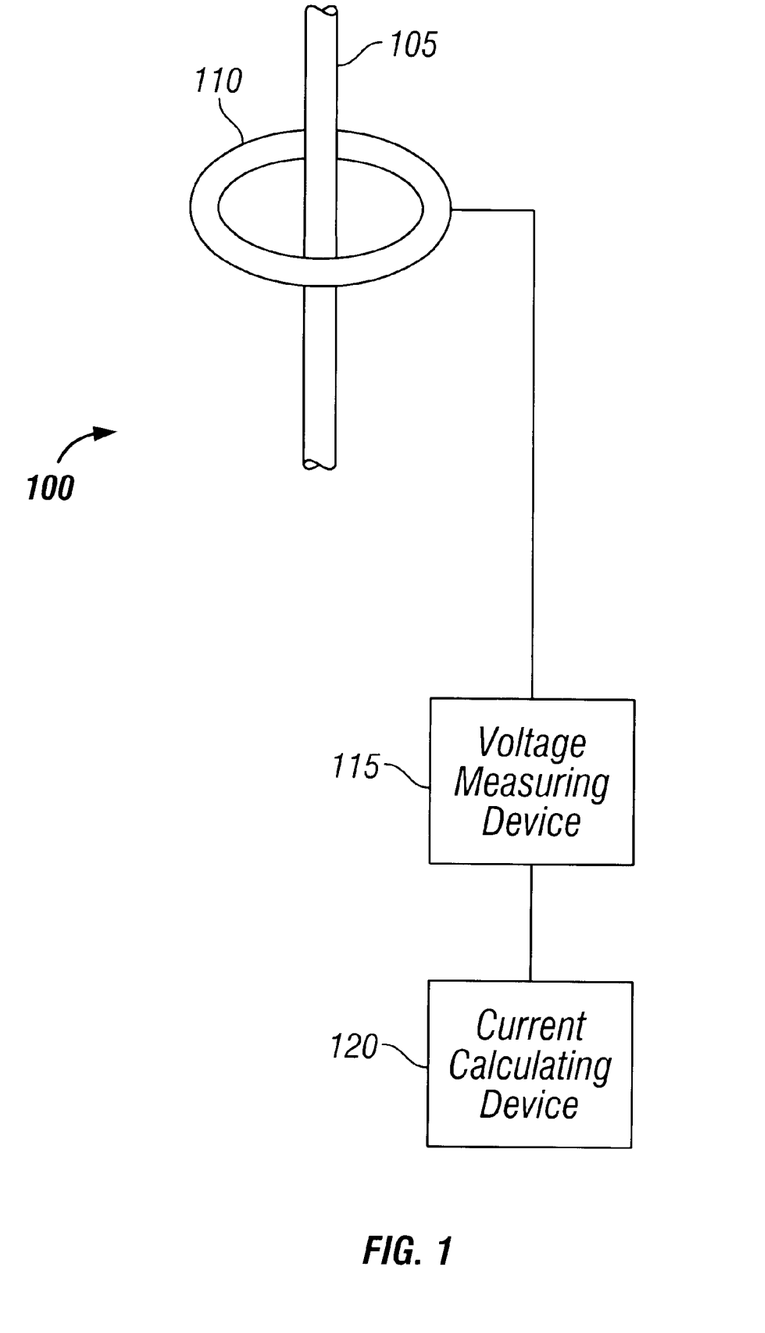
FIG. 1 is an illustration of a system for measuring current through an electrical conductor.

Referring to FIG. 1, a system 100 is used to measure a current through an electrical conductor 105. The system 100 includes a coil 110 and a voltage measuring device 115 connected to the coil 110. The voltage measuring device 115 measures a voltage induced in the coil when the electrical conductor 105 is placed within the coil 110. The current through the electrical conductor 105 may then be calculated based on the measured voltage. To this end, the system 100 may also include a current calculating device 120, which may be a computer. The current calculating device 120 is connected to the voltage measuring device 115 to calculate the current through the electrical conductor based on the voltage measured by the voltage measuring device 115. Although shown separately from the voltage measuring device 115 in FIG. 1, the current calculating device 120 may be integral with the voltage measuring device 115.

The coil 110 includes a conductive element that is wound around a non-magnetic core. The conductive element may be, for example, a metal wire or a metal deposit. The non-magnetic core may be made of any material that has a magnetic permeability that is equal to the permeability of free space. For example, the non-magnetic core may be an air core. As another example, the coil 110 may be a Rogowski coil in which the non-magnetic core is a printed circuit board (PCB) on which the conductive element is traced. The PCB may be made of an epoxy resin filled with a substance having a low coefficient of thermal expansion such as glass or ceramic.

Figure 2A:
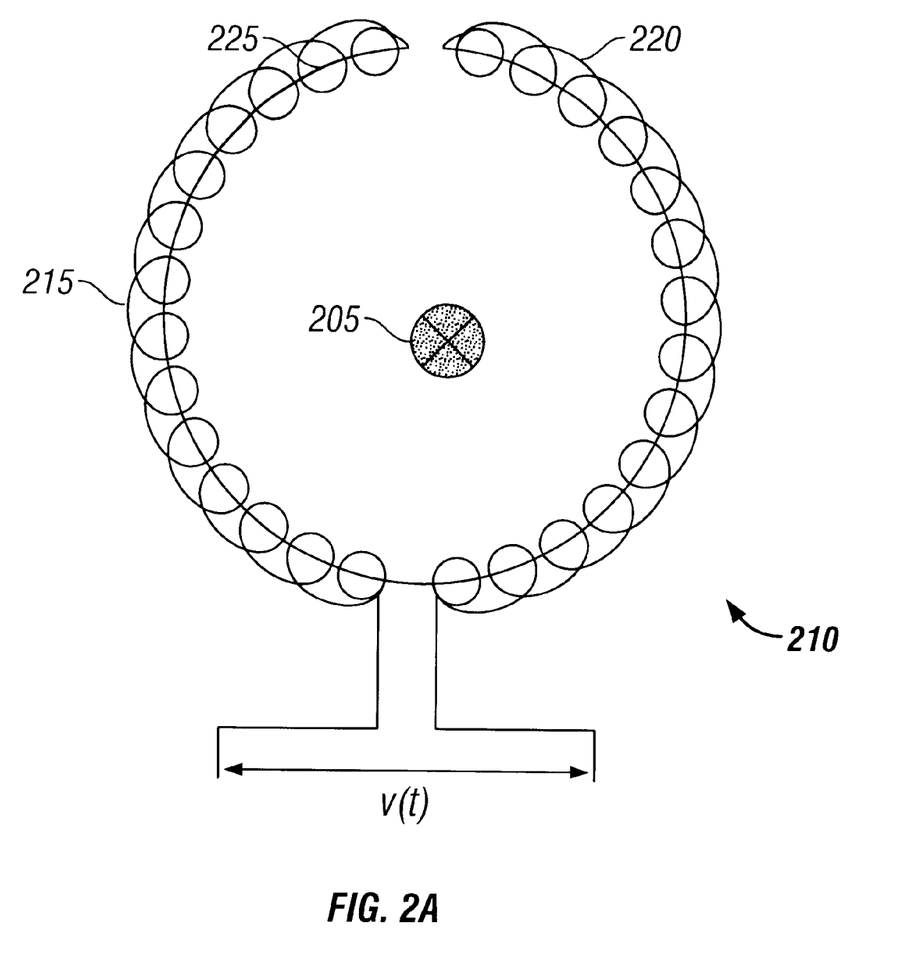
FIGS. 2A and 3A show prior designs for coils used in the system of FIG. 1.

Referring to FIG. 2A, a prior system includes a two-arm coil 210 having two arms 215, 220 that form a main loop when coupled together for receiving an electrical conductor 205. The two arms 215, 220 are configured such that the conductive element of the coil 110 winds around a non-magnetic core (not shown).

The coil 210 includes a return loop 225 that serves to reduce the influence of nearby conductors carrying high currents by canceling electrical fields coming from outside the coil 210. The return loop 225 may be formed by returning the conductive element through the center of the two-arm winding (as shown in FIG. 2A). Alternatively, the return loop may be formed by winding the conductive element around the non-magnetic core in a direction opposite from the winding of the main loop.

Figure 2B:
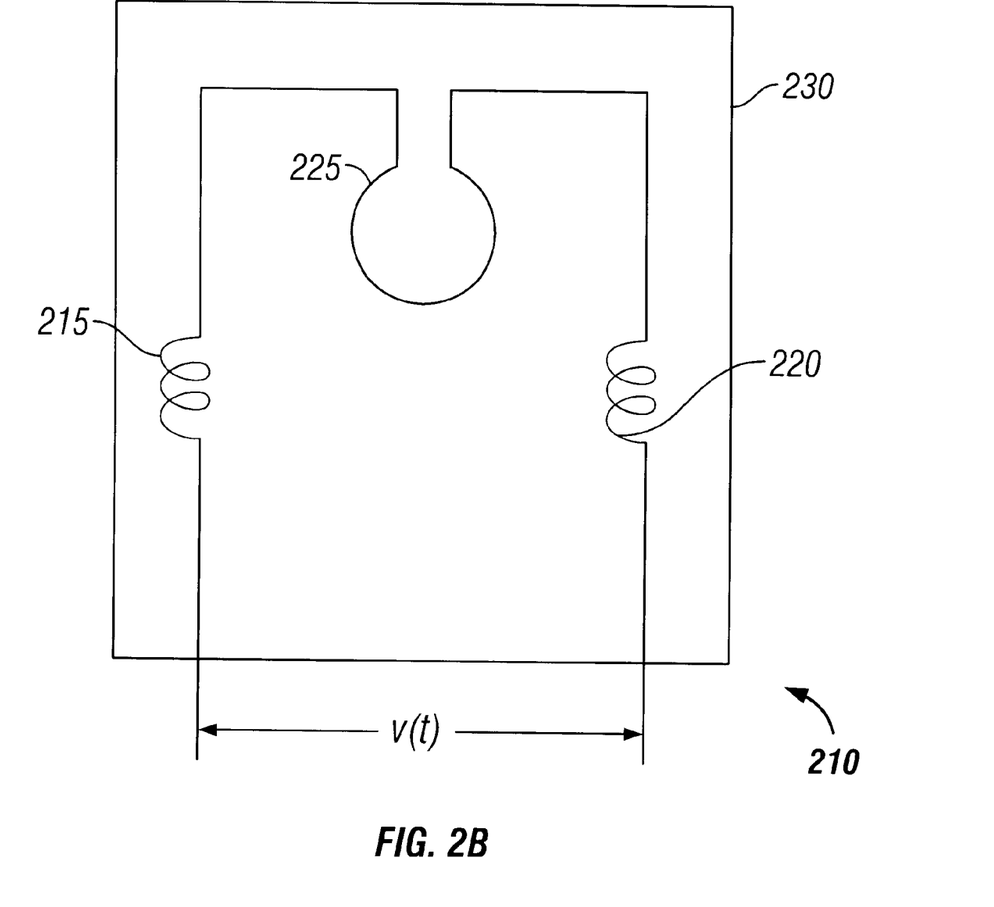
FIGS. 2B and 3B are circuit diagrams of the coil designs of FIGS. 2A and 3A, respectively.

A block diagram of the coil 210 is also shown in FIG. 2B with a representation of the non-magnetic core 230. As can be seen in FIGS. 2A and 2B, the main loop, which is made of arms 215, 220, and the return loop 225 are formed or interwoven on the same core 230. When the two loops are interwoven in this manner, they are referred to as being "coupled" together. The voltage induced in the coil 210 is measured across the arms 215, 220 in a series configuration.

Figure 3A:
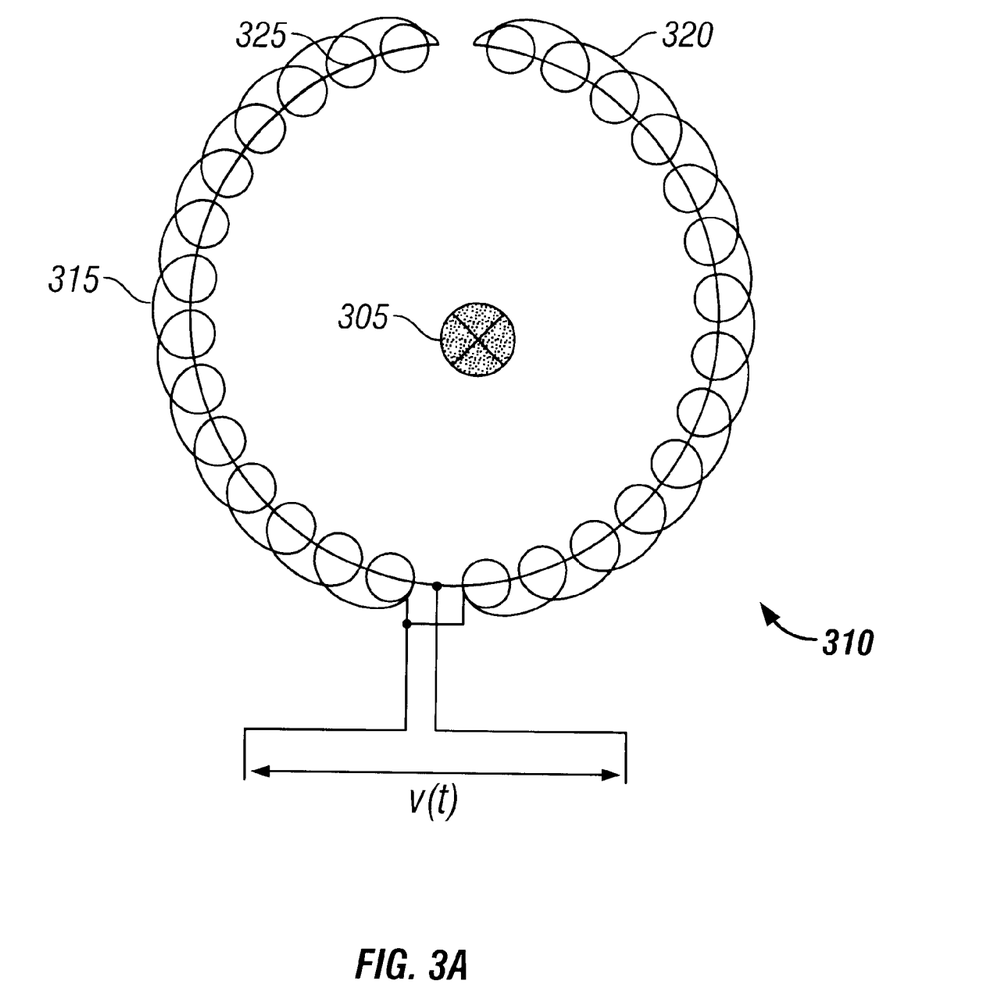

Referring to FIG. 3A, another prior system includes a two-arm coil 310 having two arms 315, 320 that form a main loop when coupled together for receiving an electrical conductor 305. The two arms 315, 320 are configured such that the conductive element of the coil 110 winds around the non-magnetic core (not shown).

The coil 310 includes a return loop 325 that serves to reduce the influence of nearby conductors carrying high currents by canceling electrical fields coming from outside the coil 310. The return loop 325 may be formed by returning the conductive element through the center of the two-arm winding (as shown in FIG. 3A). Alternatively, the return loop may be formed by winding the conductive element around the non-magnetic core in a direction opposite from the winding of the main loop.

Figure 3B:
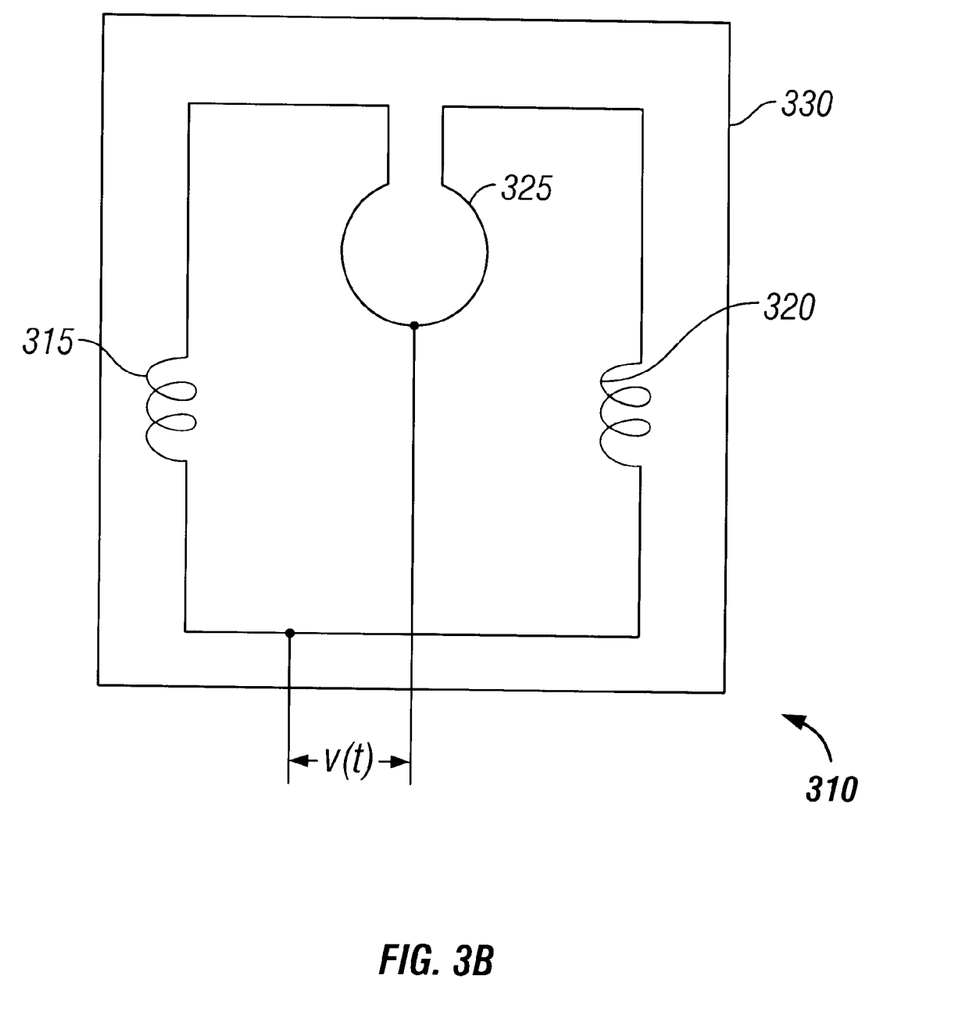

A block diagram of the coil 310 is shown in FIG. 3B with a representation of the nonmagnetic core 330. As can be seen from FIGS. 3A and 3B, the main loop, which is made of arms 315, 320, and the return loop 325 are formed on the same core 330 and are therefore coupled together. The voltage induced in the coil 310 is measured across a midpoint of the return loop 325 and a connection point between the two arms 315, 320 in a parallel configuration.

Figure 4A:
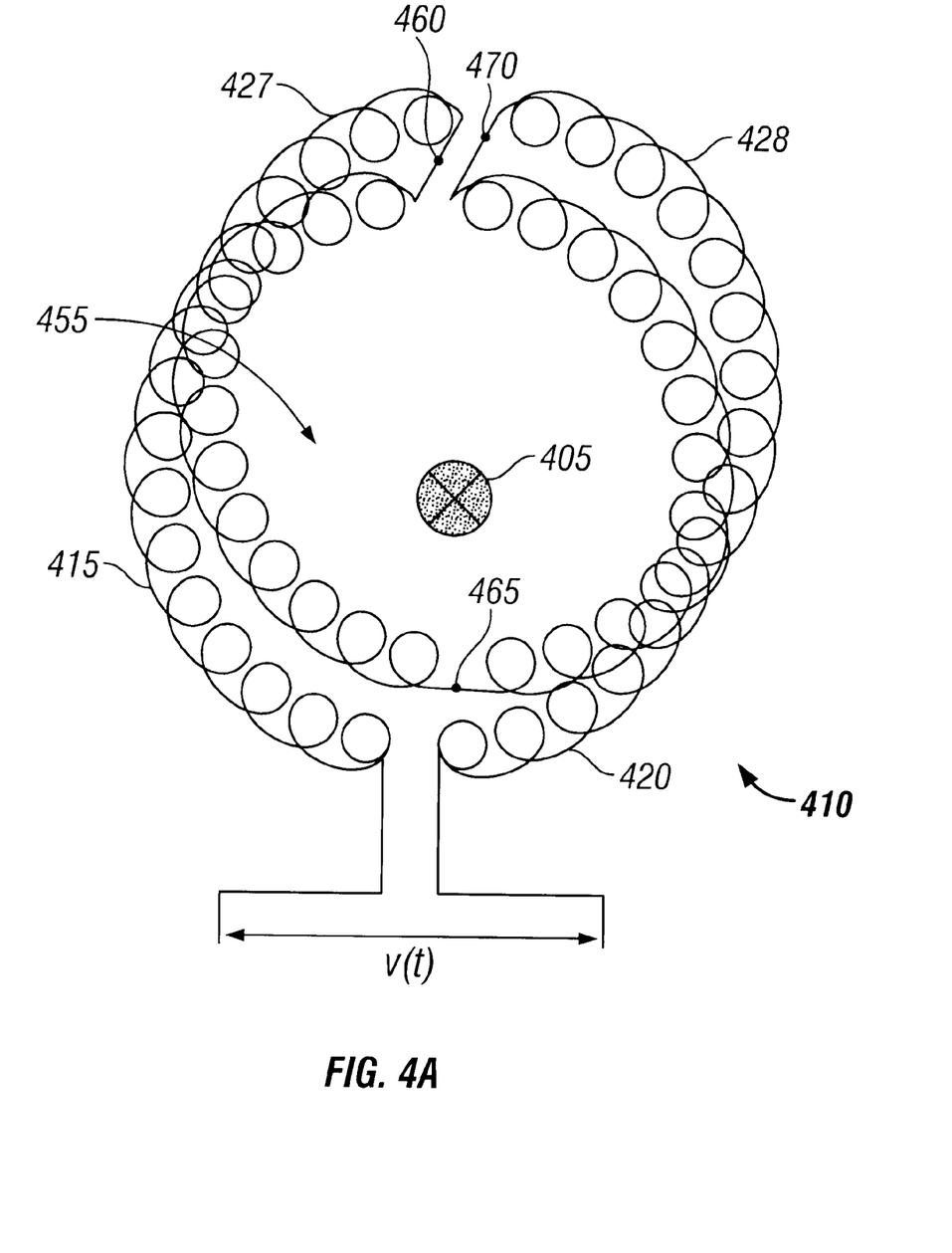
FIGS. 4A and 5A show designs for coils used in the system of FIG. 1.
Figure 4B:
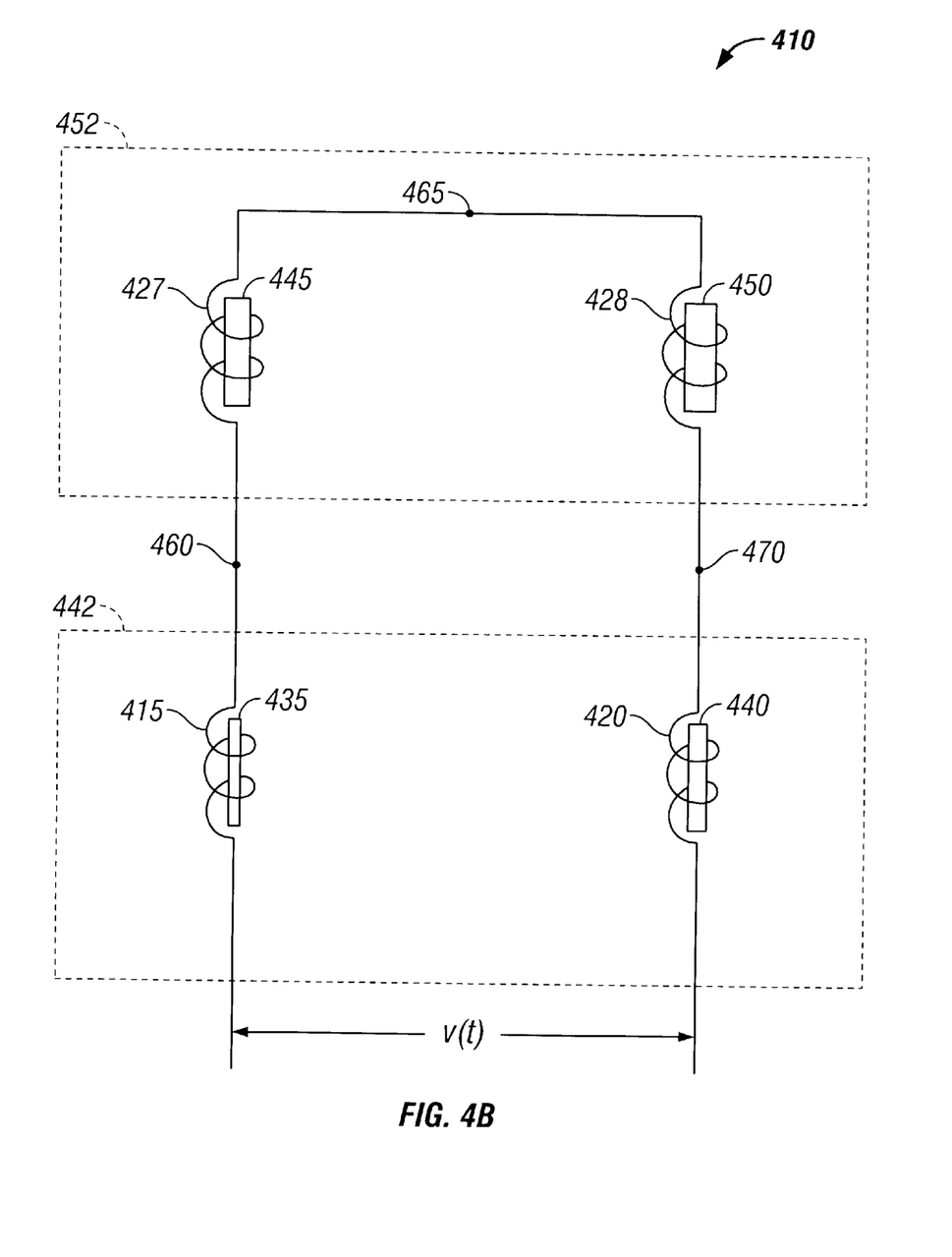
FIGS. 4B and 5B are circuit diagrams of the coil designs of FIGS. 4A and 5A, respectively.

Referring to FIGS. 4A and 4B, another design includes a two-arm coil 410 for receiving an electrical conductor 405. The coil 410 includes a first portion 415, a second portion 420, a third portion 427, and a fourth portion 428. The first portion 415 is wound in a first direction around a first core 435 (represented in FIG. 4B) and the second portion 420 is wound in the first direction around a second core 440 (represented in FIG. 4B). The first direction may be a clockwise or a counterclockwise direction.

The third portion 427 is wound in a second direction around a third core 445 (represented in FIG. 4B), which is distinct from the first or second cores 435, 440. The third portion 427 is not interwoven with and does not overlap the first or second portions 415, 420. When a portion is not interwoven with another portion, the portions are referred to as being "decoupled" from one another. Thus, the third portion 427 is decoupled from the first and second portions 415, 420. Moreover, the second direction is different from the first direction. Thus, if the first direction is clockwise, then the second direction is counterclockwise, and if the first direction is counterclockwise, then the second direction is clockwise.

The fourth portion 428 is wound in the second direction around a fourth core 450 (represented in FIG. 4B). Like the third portion 427, the fourth portion 428 is decoupled from the first and second portions 415, 420.

When the portions 415, 420, 427, and 428 are arranged, the first portion 415 mates with the second portion 420 to form a first loop 442 and the third portion 427 mates with the fourth portion 428 to form a second loop 452. In this arrangement, an inner area 455 is formed within the first and second loops 442, 452, respectively, for receiving the electrical conductor 405. The first and third portions 415, 427 are connected at a first connection point 460; the third and fourth portions 427, 428 are connected at a second connection point 465; and the fourth and second portions 428, 420 are connected at a third connection point 470. The voltage induced in the coil 410 is measured across the first and second portions 415, 420 of the coil to form a series-connection configuration.

Figure 5A:
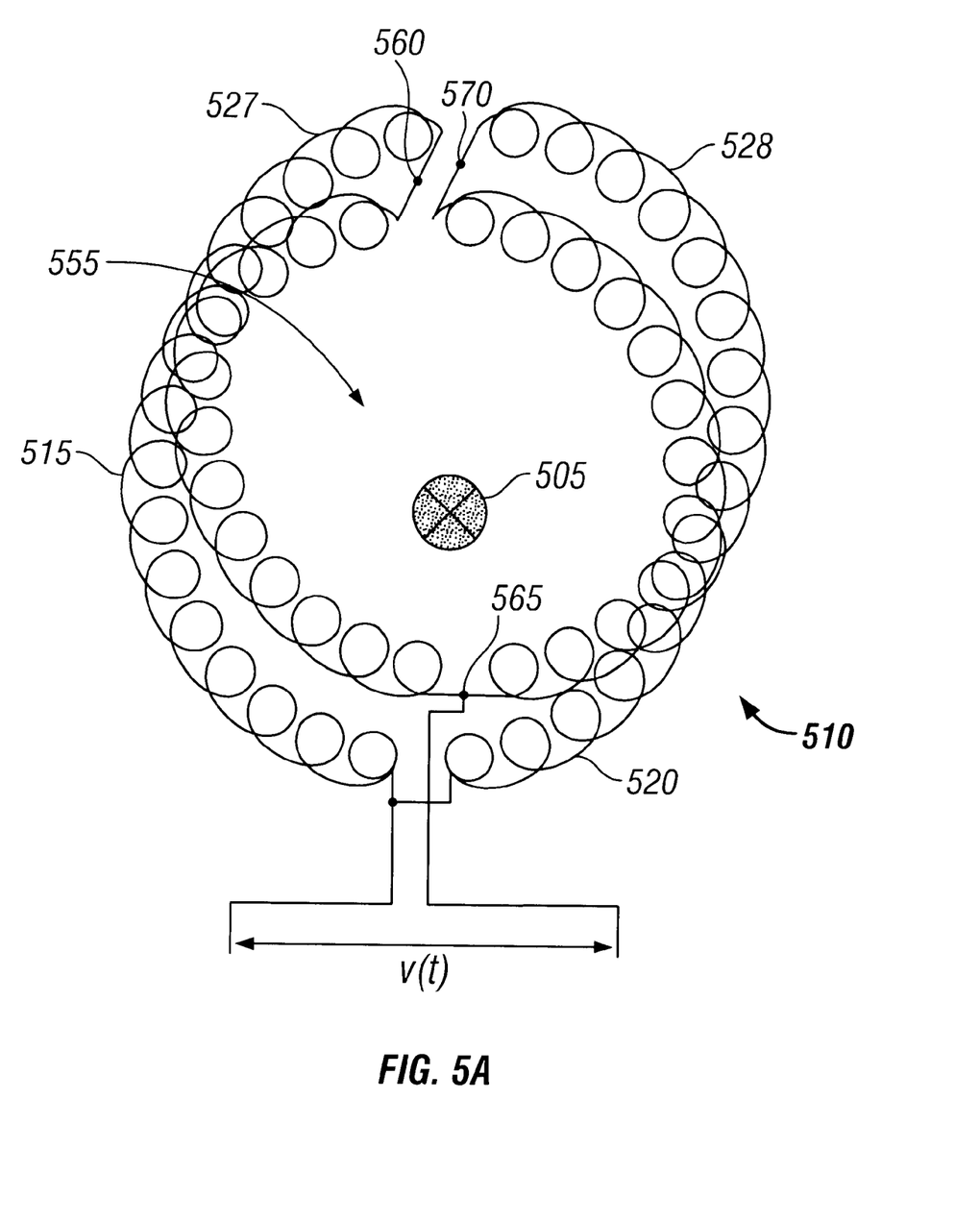
Figure 5B:
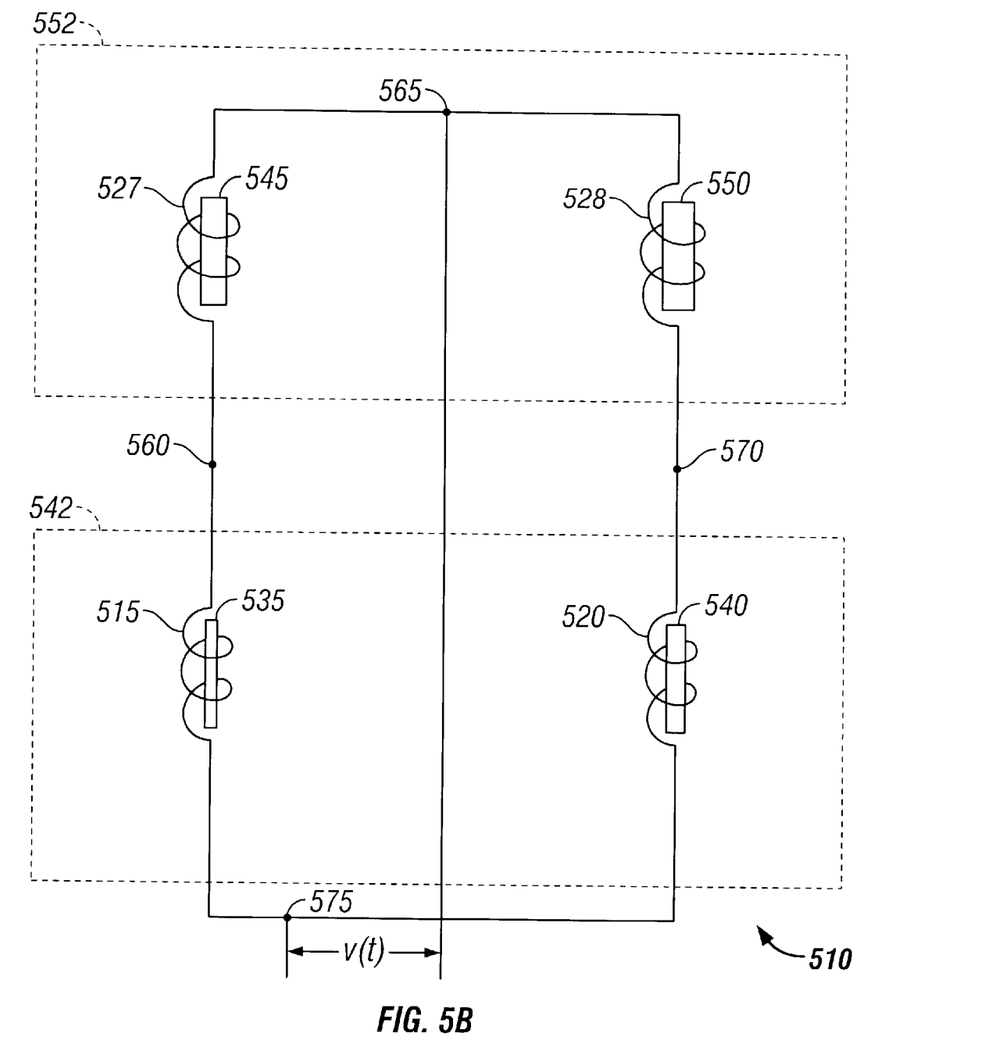

Referring to FIGS. 5A and 5B, another design includes a two-arm coil 510 for receiving an electrical conductor 505. Like coil 410, the coil 510 includes a first portion 515, a second portion 520, a third portion 527, and a fourth portion 528. The first portion 515 is wound in a first direction around a first core 535 (represented in FIG. 5B) and the second portion 520 is wound in the first direction around a second core 540 (represented in FIG. 5B). The first direction may be clockwise or counterclockwise.

The third portion 527 is wound in a second direction around a third core 545 (represented in FIG. 4B), which is distinct from the first or second cores 535, 540. In this way, the third portion 527 is decoupled from the first or second portions 515, 520. Furthermore, the second direction is different from the first direction. Thus, if the first direction is clockwise, then the second direction is counterclockwise. Alternatively, if the first direction is counterclockwise, then the second direction is clockwise. The fourth portion 528 is wound in the second direction around a fourth core 550 (represented in FIG. 5B). The fourth portion 528 is decoupled from the first and second portions 515, 520.

When the portions 515, 520, 527, and 528 are arranged, the first portion 515 mates with the second portion 520 to form a first loop 542 and the third portion 527 mates with the fourth portion 528 to form a second loop 552 (as shown in FIG. 5A). In this arrangement, an inner area 555 is formed within the first and second loops for receiving the electrical conductor 505. The first and third portions 515, 527 are connected at a first connection point 560 and the third and fourth portions 527, 528 are connected at a second connection point 565. Additionally, the fourth and second portions 528, 520 are connected at a third connection point 570 and the first and second portions 515, 520 are connected at a fourth connection point 575. The voltage induced in the coil 510 is measured across the second connection point 565 and the fourth connection point 575 to form a parallel-connection configuration.

Figure 6:
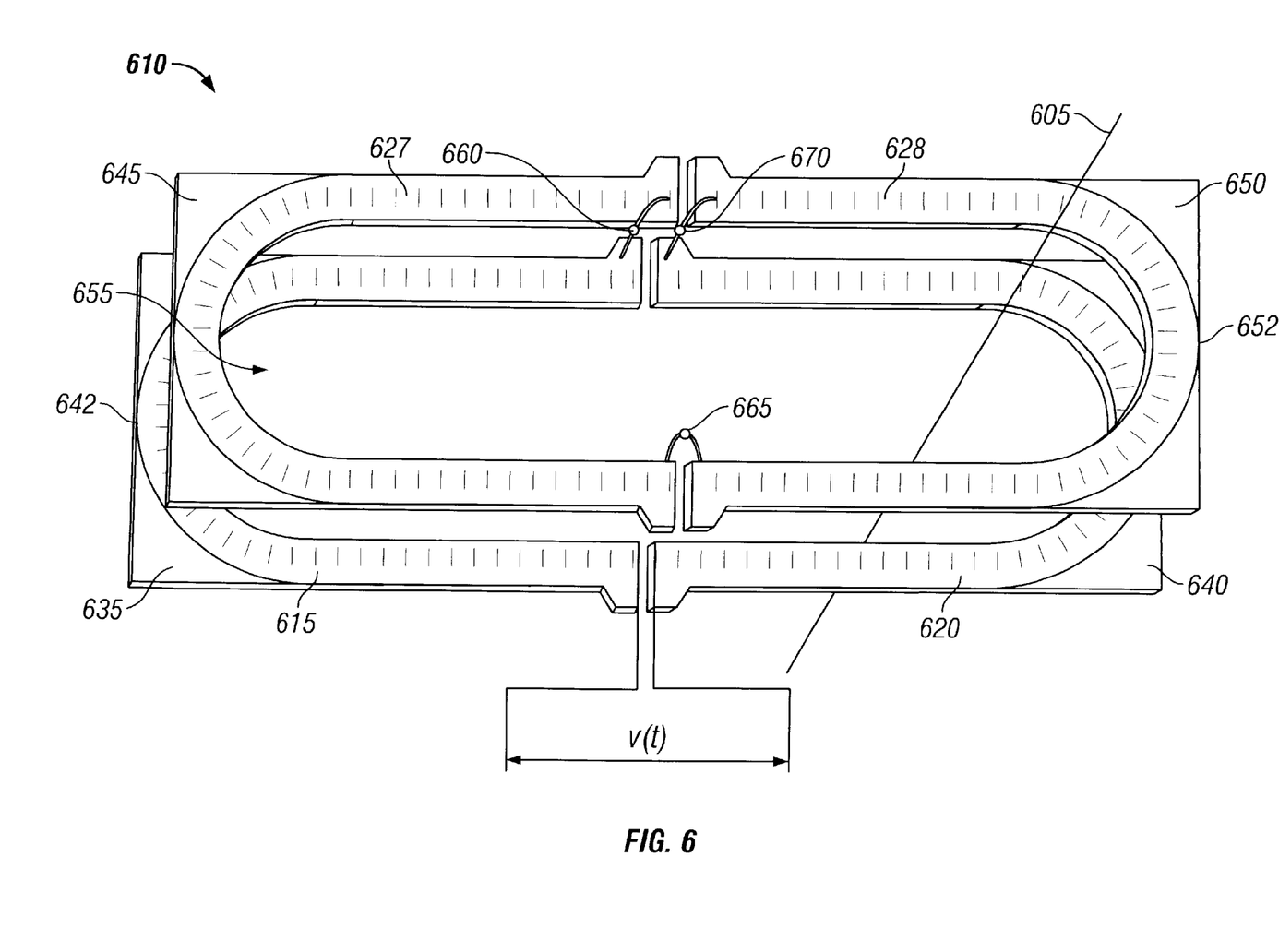
FIG. 6 shows a perspective view of a design for a coil used in the system of FIG. 1.

Referring also to FIG. 6, in one implementation, the coil 410 or 510 may be formed as a Rogowski coil 610 for receiving an electrical conductor 605. In coil 610, the conductive element in each of the portions is traced on a respective PCB core. In particular, the coil 610 includes a first portion 615 that is traced in a first direction on a first PCB core 635 and a second portion 620 that is traced in the first direction on a second PCB core 640. The first direction may be clockwise or counterclockwise. The coil 610 also includes a third portion 627 that is traced in a second direction on a third PCB core 645 and a fourth portion 628 that is traced in the second direction on a fourth PCB core 650. The third and fourth PCB cores 645, 650 are distinct from either of the first or second PCB cores 635, 640. In this way, the third portion 627 and the fourth portion 628 are decoupled from the first and second portions 615, 620. Moreover, the second direction is different from the first direction. Thus, if the first direction is clockwise, then the second direction is counterclockwise, and if the first direction is counterclockwise, then the second direction is clockwise.

Each of the PCB cores is formed as a thinly shaped piece defined by two opposing surfaces. The conductive element of the coil 610 is traced onto the PCB core by depositing a metal (such as, for example, copper) onto each of the surfaces of the PCB. As shown, the metal deposits are rectilinear and radial, depending on their location on the PCB, and form a rectangular/elliptical shape. Other shapes may be formed, including, for example, circular, triangular, or rectangular shapes. In particular, the metal deposits may be all radial, with geometric projections intersecting at a center of the coil, to form a circular coil (not shown). Alternatively, the metal deposits may be all rectilinear to form a rectangular coil (not shown).

When the portions 615, 620, 627, and 628 are arranged, the first portion 615 mates with the second portion 620 to form a first loop 642 and the third portion 627 mates with the fourth portion 628 to form a second loop 652. In this arrangement, an inner area 655 is formed within the first and second loops 642, 652, respectively, for receiving the electrical conductor 605.

The first and third portions 615, 627 are connected at a first connection point 660 and the third and fourth portions 627, 628 are connected at a second connection point 665. The fourth and second portions 628, 620 are connected at a third connection point 670. The voltage induced in the coil 610 is measured across the first and second portions 615, 620 of the coil 610 in a series configuration.

Figure 7A:
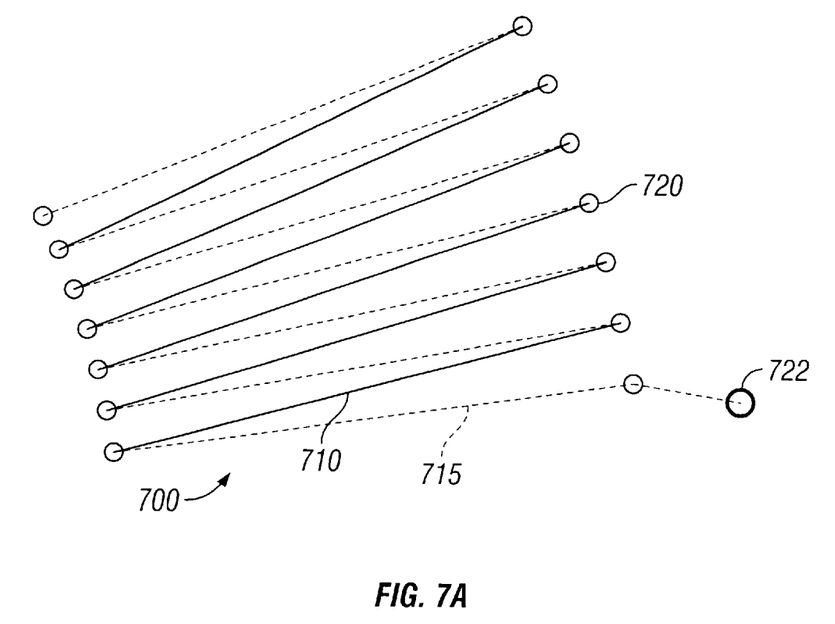
FIGS. 7A and 7B show detailed sections of the coil design of FIG. 6.

FIG. 7A shows a section 700 of the portion 615 or 620. Metal deposits on a surface of the PCB core 635 or 640 that is visible to the reader are shown as a continuous line 710 and metal deposits on the opposite surface of the PCB core that is not visible to the reader are show n as a dashed line 715. The portion 615 or 620 is traced in a counter-clockwise direction. Metal deposits on a surface of the PCB core are connected to metal deposits on the opposite surface of the PCB core through conductively plated holes 720, referred to as vias, passing through the PCB core. Connections to the portion 615 or 620 are made with plated connection pads, one of which is shown and labeled 722. For example, one connection pad on the portion 615 connects to a connection pad on the portion 627 at the first connection point 660 and the other connection pad on the portion 615 connects to the voltage measuring device 115. As another example, one connection pad on the portion 620 connects to a connection pad on the portion 628 at the third connection point 670 and the other connection pad on the portion 620 connects to the voltage measuring device 115.

Figure 7B:
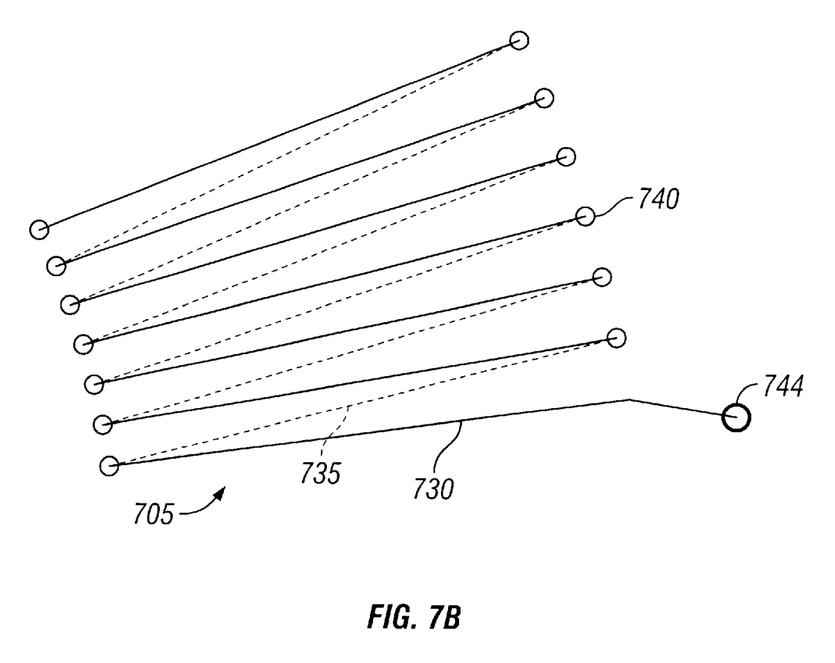

FIG. 7B shows a section 705 of the portion 627 or 628. Metal deposits on a surface of the PCB core 645 or 650 that is visible to the reader are shown as a continuous line 730 and metal deposits on the opposite surface of the PCB core that is not visible to the reader are shown as a dashed line 735. The portion 627 or 628 is traced in a clockwise direction. Metal deposits on a surface of the PCB core are connected to metal deposits on the opposite surface of the PCB core through vias 740 passing through the PCB core. Connections to the portion 627 or 628 are made with plated connection pads, one of which is shown and labeled 744. Thus, as mentioned above, one connection pad on the portion 627 connects to a connection pad on the portion 615 at the first connection point 660, and the other connection pad on the portion 628 connects to a connection pad on the portion 620 at the third connection point 670. Additionally, another connection pad on the portion 627 connects to a connection pad on the portion 628 at the second connection point 665.

In general, the first and second loops in a coil 410, 510, or 610 are arranged to permit connection at the connection points and are positioned relative to each other at any suitable distance. For example, the distance that separates the first and second loops may depend on the required measurement precision for the coil.

Other implementations are within the scope of the following claims.

For example, the Rogowski coil may be designed with a higher density in which a number of traces per unit length is increased by offsetting the vias in, for example, a radial direction. In this way, each of the portions includes two sets of conductive elements traced on the PCB core. Both of the sets progress in one direction.

The coil may be designed with more than two layers of loops. The current measuring system may be used to measure current in each phase of a multi-phase circuit. For example, if the circuit is a three-phase circuit, then the current measuring system includes three coils, one for each phase.

The first and second loops 642, 652 may be laminated together to form a monolithic PCB assembly. Such an assembly protects and insulates the coil from moisture and electromagnetic shorts. The current measuring system may include an electronic measurement and/or acquisition circuit. The voltage measuring device 115 may perform integration on the measured voltage to produce a voltage that is proportional to current. To perform integration, the device 115 may include an RC integrator or an operational amplifier.

The coil may be made of any shape and size. For example, each of the first and second loops of the coil may be made of any suitable number of portions, such as, for example, three or four portions. Additionally, the shape of the coil may be adjusted by adjusting the shape of each of the portions that make up the first and second loops. One of the portions that forms a loop may have a shape that is different from the shape of the other portion that forms that loop. In this way, an asymmetrical coil may be formed.

What is claimed is:

1. A coil comprising:
    a first portion wound in a first direction around a first core;
    a second portion wound in the first direction around a second core;
    a third portion wound in a second direction around a third core and decoupled from the first and second portions, the second direction being different from the first direction; and
    a fourth portion wound in the second direction around a fourth core, and decoupled from the first and second portions;
    in which the first and second portions mate to form a first loop, the third and fourth portions mate to form a second loop, the first and second loops define an inner area that is configured to receive an electrical conductor;
    in which a voltage is induced in the coil if an electrical conductor is placed in the inner area.

2. The coil of claim 1 in which:
    the first portion is traced on a first printed circuit board that forms the first core, the second portion is traced on a second printed circuit board that forms the second core, the third portion is traced on a third printed circuit board that forms the third core, and the fourth portion is traced on a fourth printed circuit board that forms the fourth core.

3. The coil of claim 2 in which the first and second printed circuit boards are laminated with the third and fourth printed circuit boards.

4. The coil of claim 1 in which:
    the first and second portions mate to form a first loop, the third and fourth portions mate to form a second loop; and the first and second loops define the inner area.

5. The coil of claim 4 in which the first and second loops are rectangular.

6. The coil of claim 4 in which the first and second loops are circular.

7. The coil of claim 4 in which the first and second loops are elliptical.

8. The coil of claim 1 in which the first direction is clockwise and the second direction is counterclockwise.

9. The coil of claim 1 in which the first, second, third, and fourth cores are non-magnetic.

10. The coil of claim 1 in which the third and fourth portions are connected at a connection point.

11. The coil of claim 10 in which:
    the first and third portions are connected at a connection point and the fourth and second portions are connected at a connection point.

12. The coil of claim 11 in which the voltage induced in the coil is measured across the first and second portions of the coil.

13. The coil of claim 11 in which the first and second portions are connected at a connection point and the voltage induced in the coil is measured across the connection point connecting the third and fourth portions and the connection point connecting the first and second portions.

14. The coil of claim 1 in which the inner area is formed between the first and second portions and the third and fourth portions.

15. The coil of claim 1 in which the inner area is configured to receive the electrical conductor.

16. A system for measuring a current, the system including:
    a coil comprising:
        a first loop including a first portion wound in a first direction around a first core, and a second portion wound in the first direction around a second core, the second portion coupling with the first portion; and
        a second loop including a third portion wound in a second direction around a third core and decoupled from the first and second portions, the second direction being different from the first direction, and a fourth portion wound in the second direction around a fourth core and decoupled from the first and second portions;
    in which the first and second loops define an inner area that is configured to receive an electrical conductor; and
    a voltage measuring device that measures a voltage induced in the coil when an electrical conductor is placed in the inner area.

17. The system of claim 16 further comprising a current calculating device connected to the voltage measuring device and configured to calculate the current through the electrical conductor based on the measured voltage.

18. The system of claim 16 further comprising another coil identical in design to the coil; in which the voltage measuring device measures voltage induced in the other coil when an electrical conductor is placed in an inner area of the other coil.

19. The system of claim 16 in which:
    the first portion is traced on a first printed circuit board that forms the first core,
    the second portion is traced on a second printed circuit board that forms the second core,
    the third portion is traced on a third printed circuit board that forms the third core, and
    the fourth portion is traced on a fourth printed circuit board that forms the fourth core.

20. The system of claim 16 in which the third and fourth portions are connected at a connection point.

21. The system of claim 20 in which:
    the first and third portions are connected at a connection point, and the fourth and second portions are connected at a connection point.

22. The system of claim 21 in which the voltage induced in the coil is measured across the first and second portions of the coil.

23. The system of claim 21 in which the first and second portions are connected at a connection point and the voltage induced in the coil is measured across the connection point connecting the third and fourth portions and the connection point connecting the first and second portions.

24. A coil comprising:
    a first loop including a first portion wound in a first direction around a first core; and a second portion wound in the first direction around a second core; and
    a second loop including a third portion wound in a second direction around a third core and decoupled from the first and second portions, the second direction being different from the first direction; and a fourth portion wound in the second direction around a fourth core and decoupled from the first and second portions;
    in which the first and second loops define an inner area that is configured to receive an electrical conductor.

25. The coil of claim 24 in which the first portion is traced on a first printed circuit board that forms the first core, the second portion is traced on a second printed circuit board that forms the second core, the third portion is traced on a third printed circuit board that forms the third core, and the fourth portion is traced on a fourth printed circuit board that forms the fourth core.

* * * * *